(12) United States Patent
Hirata et al.

(10) Patent No.: US 6,416,590 B1
(45) Date of Patent: Jul. 9, 2002

(54) SOLDER POWDER AND METHOD FOR PREPARING THE SAME AND SOLDER PASTE

(75) Inventors: Masahiko Hirata, Nara; Takashi Ohashi, Kyoto; Hisahiko Yoshida, Osaka; Hiroji Noguchi, Kyoto; Takao Hisazumi, Osaka; Mamoru Senna, Tokyo; Tetsuhiko Isobe, Kanagawa, all of (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 09/720,722

(22) PCT Filed: Jul. 1, 1999

(86) PCT No.: PCT/JP99/03568

§ 371 (c)(1),
(2), (4) Date: Dec. 28, 2000

(87) PCT Pub. No.: WO00/01506

PCT Pub. Date: Jan. 13, 2000

(30) Foreign Application Priority Data

Jul. 2, 1998 (JP) ............................................. 10-187347
Mar. 11, 1999 (JP) ............................................. 11-064472

(51) Int. Cl.$^7$ ................................................. B22F 1/02
(52) U.S. Cl. ............................. 148/24; 75/721; 75/739; 75/741
(58) Field of Search ............................. 148/24; 75/721, 75/739, 741

(56) References Cited

U.S. PATENT DOCUMENTS 5,211,763 A * 5/1993 Takemoto et al. ............ 148/23
6,159,304 A * 12/2000 Noguchi et al. ............ 148/23

FOREIGN PATENT DOCUMENTS

| EP | 855 242 | 7/1998 |
|---|---|---|
| JP | 1-157793 | 6/1989 |
| JP | 4-147787 | 5/1992 |
| JP | 4-200993 | 7/1992 |
| JP | 8-164496 | 6/1996 |
| JP | 8-215884 | 8/1996 |
| JP | 9-253882 | 9/1997 |
| JP | 9-327789 | 12/1997 |
| JP | 2780474 | 5/1998 |
| JP | 10-175092 | 6/1998 |

OTHER PUBLICATIONS

Partial translation of: "4th Symposium on 'Microjoining and Assembly Technology in Electronics'", pp. 271–274, Jan. 29, 1998.

Verification of Translation.

English translation of International Preliminary Examination Report.

* cited by examiner

Primary Examiner—Daniel J. Jenkins
(74) Attorney, Agent, or Firm—Merchant & Gould PC

(57) ABSTRACT

An organic acid salt is deposited on the surface of a solder powder containing Sn and Zn. Alternatively, 0.5 to 10 wt. % of a nonionic surfactant is added to a flux. By a method comprising such a procedure, provided are a lead-free solder powder and solder paste having good soldering characteristics wherein the reaction of an activating component with an alloy component in a flux is suppressed.

23 Claims, 12 Drawing Sheets

SOLDER POWDER AND METHOD FOR PREPARING THE SAME AND SOLDER PASTE

TECHNICAL FIELD

The present invention relates to a solder powder to be used together with a flux in a solder paste (soldering paste). More particularly, the present invention relates to a method for preparing such a solder powder, and to a solder paste including a solder powder and a flux.

BACKGROUND ART

As is customary in this field, throughout this specification, for example "63Sn—Pb" means a composition of 63 wt % Sn and Pb for the remaining portion, and for example "Sn-8Zn-3Bi" means a composition of 8 wt % of Zn, 3 wt % of Bi, and Sn for the remaining portion.

Methods for applying solder to electronic parts include, for example, soldering with a soldering iron, immersing, and reflow soldering (referred to as "reflowing" below). For the surface mounting of for example IC chips, reflowing is used, because bridges between the leads of the surface-mounted parts do not develop easily, and this method is superior to other methods with regard to productivity. In reflowing, a solder paste including a mixture of a powder of a solder alloy and a flux usually is printed on certain soldering positions using a metal mask or a silk screen, heated in a reflow furnace, thereby applying the solder.

For soldering by reflowing, a Sn—Pb alloy is commonly used. Since Sn—Pb alloys have the lowest melting point as an eutectic composition (which is 183° C. for 63Sn—Pb), the soldering temperature is comparatively low at about 220 to 230° C. Therefore, the danger of damaging the electric parts by heat is small. Moreover, Sn—Pb alloys have very good soldering properties. However, since these solder alloys contain Pb, there is considerable concern that the Pb that is washed out of disposed electric appliances contaminates the groundwater and reaches the human body, for which it is a serious health threat. For this reason, Sn—Ag alloys, Sn—Sb alloys, Sn—Bi alloys, and Sn—Zn alloys have been proposed as lead-free solder alloys.

Among Sn—Ag alloys, an eutectic composition of Sn-3.5Ag has the lowest melting point, which is 221° C. With this composition, the soldering temperature will be as high as 260–270° C. Among Sn—Sb alloys, a composition of Sn-5Sb has the lowest melting point, which is 235° C. in the solidus line and 240° C. in the liquidus line. For this composition, the soldering temperature is 280–300° C. which is even higher than for Sn-3.5Ag. For Sn—Bi alloys, the eutectic temperature of eutectic Sn-58Bi is 139° C. This eutectic temperature is sufficiently low, but Sn—Bi alloys are brittle and hard, so that they result in inferior mechanical properties such as the tensile strength of the soldered parts.

For Sn—Zn alloys, the eutectic temperature of eutectic Sn-9Zn is 199° C. This eutectic temperature is close to the eutectic temperature of 183° C. for conventional 63Sn—Pb eutectic solder. Moreover, Sn—Zn alloys have excellent mechanical properties.

However, there are also deficiencies in the soldering properties of Sn—Zn alloys. To improve the soldering properties of Sn—Zn alloys and increase its mechanical strength, it has been proposed to add a suitable amount of for example Ag, Cu, Bi, In, Ni, or P to the Sn—Zn alloy to obtain a Sn—Zn-based solder alloy (see for example JP-A-9-253882).

Moreover, since the reactivity of the Zn in the Sn—Zn alloy is strong, neighboring solder particles cluster together easily, so that the viscosity of the solder rises when used as a paste. If the viscosity of a solder paste becomes too large, the printing of the paste on the board becomes difficult. Since the surface of the Zn in the Sn—Zn-based alloy oxidizes easily, the melting point of the alloy tends to increase as well. It has been proposed to lower the viscosity of the paste by increasing the amount of activator (for example an amine-halogenated salt of a hydroacid) in the flux used together with the Sn—Zn-based solder alloy.

JP-A-9-327789 proposes an improved flux for suppressing a change of the paste viscosity over time. The flux that is disclosed in this publication includes an organic acid such as malic acid or tartaric acid, which includes a carboxyl group and a hydroxyl group. These organic acids suppress the reaction between Zn and other polymers included in the flux components, thereby relaxing the increase of the flux viscosity. This flux also includes an organic component such as ester phthalate or sorbitan fatty acid ester. These organic components suppress reactions of the Sn—Zn-based alloy by adhering to the surface of the solder alloy.

JP-A-215884 attempts to coat a powder of the solder alloy itself before mixing it with the flux. The specific method disclosed in this publication is to immerse a powder of Bi-43Sn solder alloy of 10 to 45 μm particle size in an aqueous solution including a corrosion inhibitor such as a benzothiazol derivative, an amine, or a thiourea.

However, as is disclosed in JP-A-9-253882, even when the characteristics of the Sn—Zn-based solder powder were improved by adding small amounts, the soldering properties for the reflow method were still insufficient. In particular, there was the problem that copper foil land portions on the printed circuit board remained without wetting the soldering portions completely. There was also the problem that the solder paste flowed from the copper foil portions between the semiconductor leads, and adhered to the printed circuit board in form of solder balls.

If the amount of the activator in the flux is increased to lower the viscosity of the paste, then the problem results that the activator remaining after the soldering process whitens because of age deterioration, and the strength and conductivity of the solder connection are lowered.

As explained in JP-A-9-327789, the contact between the activator component in the flux and the solder powder cannot be prevented effectively by coating the solder alloy particles with components in the flux.

JP-A-8-215884 discloses specifically only a Sn—Bi alloy, and does not disclose any material or method for preventing the thickening of a solder paste including a highly reactive metal, such as Zn.

With conventional methods, such as the ones mentioned above, the change of the Sn—Zn-based solder alloy over time cannot be suppressed sufficiently. If the thickening cannot be suppressed sufficiently, the so-called pot life is shortened, and the problem results that when applying the solder paste to a circuit board by screen printing, it becomes difficult to print the solder powder through the mesh and the holes in the mask tend to clog.

DISCLOSURE OF THE INVENTION

It is an object of the present invention to provide a solder powder including Sn and Zn, which has good soldering properties, and wherein reactions between the activation component in the flux and the alloy component can be suppressed. It is a further object of the present invention to provide a method for preparing such a solder powder. It is a further object of the present invention to provide a solder paste including Sn and Zn, having good soldering properties, whose change over time can be suppressed.

To achieve these objects, a solder powder of the present invention, which constitutes a solder paste together with a flux, includes Sn and Zn, wherein a salt of an organic acid is adhered to a surface of the solder powder.

Even when the solder powder of the present invention is used together with a flux, a reaction with the activation component in the flux can be prevented, while maintaining good soldering properties.

A first solder paste according to the present invention includes the above-noted solder powder and a flux. A second solder paste according to the present invention includes a solder powder and a flux, wherein the solder powder includes Sn and Zn, and the flux includes 0.5 to 10 wt % of a nonionic surfactant.

With the solder paste of the present invention, a change of the solder paste over time can be prevented, while maintaining good soldering properties.

A method for preparing a solder powder in accordance with the present invention includes preparing a solution saturated with a salt of an organic acid, and contacting the salt of an organic acid with a solder powder comprising Sn and Zn so as to adhere the salt of an organic acid to a surface of the solder powder.

Throughout this specification, a "solution saturated with a salt of an organic acid" means a solution containing the soluble limit (saturated solution) or more (oversaturated solution) of a salt of an organic acid.

BEST MODE FOR CARRYING OUT THE INVENTION

Figure 1:
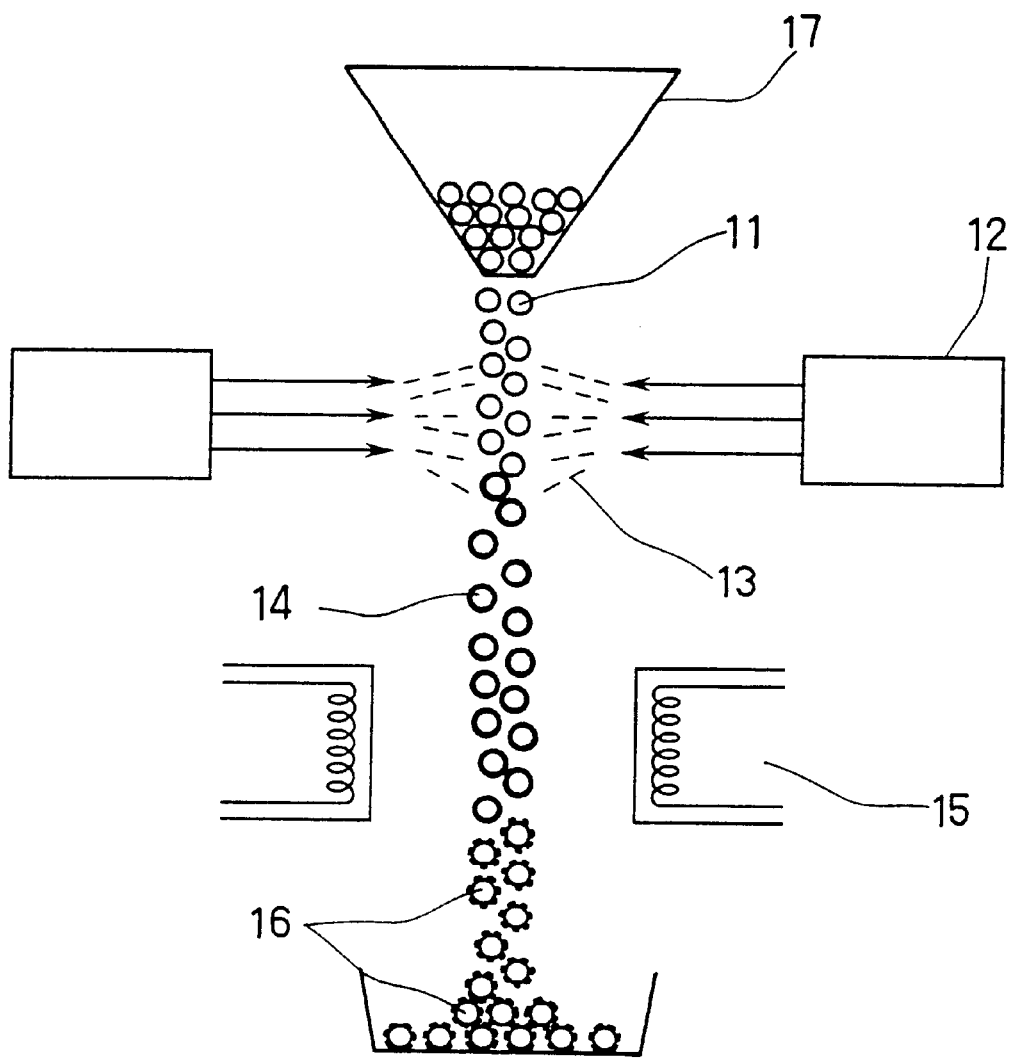
FIG. 1 is a drawing showing the configuration of a device used for preparing a solder powder in accordance with the present invention.

The following is a description of the preferred embodiments.

A Sn—Zn-based alloy is used for the solder powder, but it is preferable to add Bi to this alloy, because this lowers the melting point to around the melting point of a Sn—Pb-based alloy. Expressing the composition of such a Sn—Zn—Bi-based alloy in wt %, it is preferable that it contains 70 to 95% of Sn, 5 to 30% of Zn and the remainder Bi. A Sn—Zn—Bi—Ag-based alloy, additionally containing Ag, is also adequate, and in this case, as a particular composition expressed in wt %, 2 to 10% of Zn, 10 to 30% of Bi, 0.05 to 2% of Ag, and the remainder Sn is preferable.

Although there is no particular limitation, it is preferable that the solder powder has an average particle size of 10 to 100 µm.

For the salt of an organic acid, a fatty acid salt is preferable, and even more preferable is a fatty acid salt with eleven carbons or more. Suitable examples of fatty acid salts include, in particular, the salts of lauric acid, myristic acid, palmitic acid, stearic acid, and combinations thereof. These fatty acid salts are relatively common and safe.

Moreover, considering the reliability of the flux residue in the soldering portion, it is preferable that the salt of an organic acid is a salt that is included in the flux. The salt of an organic acid can be selected in accordance with the flux used in combination, but it is preferable that it is for example a salt of phthalic acid, citric acid, stearic acid or a combination thereof.

Moreover, it is preferable that the salt of an organic acid contains a metal other than an alkali metal, and it is even more preferable that it is a salt of an organic acid with a salt base including a transition metal.

It is preferable that the salt of an organic acid is a copper salt with an organic acid, and suitable salts include in particular copper phthalate, copper citrate, copper laurate, copper myristate, copper palmitate, and copper stearate. A copper salt of an organic acid improves the soldering properties particularly well. Moreover, to improve the soldering properties, it is preferable that a salt of an organic acid such as a copper salt of an organic acid adheres to at least 5% of the surface of the solder powder. The reason why a copper salt of an organic acid is suitable to improve the soldering properties, is probably because it possesses a good affinity with copper and tin.

In order to sufficiently suppress a change of the solder paste over time, it is preferable that the salt of an organic acid adheres in the form of a thin film to the surface of the solder powder. If the surface of the solder particles is covered by a thin continuous film of salt of an organic acid, a reaction between the activation component in the flux and the solder alloy can be suppressed. A film thickness of 0.1 to 10 µm for the thin film is preferable, especially preferable is a film thickness of 0.1 to 5 µm.

Reactions between the activation component of the flux and the Zn increase the viscosity of Sn—Zn-based alloy solder powders, which is detrimental to its capability to wet for example a copper foil. However, if the solder particles are covered by a salt of an organic acid, oxidation of the Zn does not occur easily, and it is possible to suppress a decrease of its wetting capability. Consequently, it is possible to decrease the amount of the activator added to the flux in order to ensure the wetting capability. An activator of, for example, halogenated salt of a hydroacid used to be a cause for bleaching after the soldering, but if the coated Sn—Zn-based alloy solder powder is used in combination with a flux wherein the added amount of activator has been decreased (for example to at most 10 wt % of the flux, preferably at most 3 wt %), preferable results can be attained also with regard to suppressing a deterioration of the soldering portion. The reduction of the activator in the flux is also preferable with regard to extending the so-called pot life.

Also if special emphasis is put on the suppression of a change of the solder paste over time, a copper salt of an organic acid is effective, but it is also preferable that the salt of an organic acid includes one of the metals included in the solder alloy, because with a good affinity, a solid coating can be attained. Taking the particularly preferable stearates as an example, in the case of Sn—Zn—Bi-based alloys serving as the solder alloy, zinc stearate and bismuth stearate are especially preferable for the salt of an organic acid. In the case of Sn—Zn—Bi—Ag-based alloys, zinc stearate, bismuth stearate, and silver stearate are especially preferable for the metal component.

As for the flux used together with the solder powder coated with a salt of an organic acid, conventional fluxes can be used without any particular restriction. The flux generally includes pine resin (as a base material), an activator and a solvent, more particularly natural rhodine or synthetic rhodine as a base material, an amine-halogenated salt of a hydroacid such as diethylamine hydrochloride as an activator, and diethyleneglycol monobutyl ether or ethyleneglycol monophenyl ether as a solvent. Moreover, a suitable amount of a thixo agent is added to the flux.

It is preferable that the flux includes a nonionic surfactant. The addition of a nonionic surfactant has the effect of improving the soldering properties and suppresses thickening. It is preferable that the amount of nonionic surfactant added to the flux is 0.5 to 10 wt % of the flux.

If a flux is used to which a nonionic surfactant has been added, the nonionic surfactant bonds to the periphery of the solder powder, thereby preventing clustering among the solder powder particles, which has the effect of suppressing the thickening of the solder paste. Moreover, it prevents oxidization in the reflow method, so that the creation of solder balls can be prevented.

If the flux is used together with a Sn—Zn-based alloy solder powder to which no salt of an organic acid adheres, then an amount of nonionic surfactant corresponding to 0.5 to 10 wt % of the flux is added. If the added amount is less than 0.5 wt %, the effect of the additive is not sufficient, and if the added amount is more than 10 wt %, the soldering properties are harmed.

There is no particular limitation to the nonionic surfactant, other than that it is nonionic, and for example polyoxyethylenecetyl ether (for example, "BC-40TX", product by Nikko Chemicals K.K.), or polyoxyethylenesorbitan monooleate (for example, "TO-10", product by Nikko Chemicals K.K.) are appropriate.

The following is an explanation of a method for preparing a soldering powder to which an organic acid adheres.

The soldering powder can be prepared by one of the conventional methods such as centrifugal spray drying or gas atomization.

In addition to the solder powder, a solution saturated with salt of an organic acid is prepared. The solvent for this solution can be chosen as is appropriate for the preparing method. For example, if the salt of an organic acid is adhered to the surface of the powder salt by dispersing the solder powder in the solution, then a solvent in which this salt of an organic acid is soluble is preferable. If the salt of an organic acid is for example a fatty acid salt, suitable organic solvents include for example benzene, toluene, tetrahydrofuran. Moreover, petroleum solvents such as kerosene are also appropriate. The solution saturated with salt of an organic acid can be prepared for example by solving a salt of an organic acid into the solvent until oversaturated, and filtering this oversaturated solution. Alternatively, it can also be used as an oversaturated solution of a salt of an organic acid without filtering. Moreover, it is also possible to prepare a saturated solution of a salt of an organic acid, and deposit the salt of an organic acid on the surface of the solder powder while reaching oversaturation.

On the other hand, in the methods for adhering the salt of an organic acid to the surface of the solder powder by spraying a solution that is saturated with the salt of an organic acid onto the solder powder, the solvent is not limited to solvents in which the salt of an organic acid is soluble, but it is also possible to use a solvent in which the salt of an organic acid is not very soluble or insoluble. For example, copper stearate, which is a preferable copper salt of an organic acid, is hardly soluble in lower alcohols such as methanol, ethanol, isopropanol, etc. However, these lower alcohols can be easily removed by drying and can be handled easily while being relatively inexpensive, so that they are suitable for mass-production. With this method, it is preferable to use an oversaturated solution of a salt of an organic acid.

First Embodiment

The following is an explanation of a first embodiment of a method for preparing the present invention. This embodiment relates to a method for adhering the salt of an organic acid to a solder powder in free fall by spraying a solution that is oversaturated with the salt of an organic acid onto the solder powder.

As shown in FIG. 1, in this embodiment, a solution 13 that is oversaturated with a copper salt of an organic acid is sprayed from a spraying device 12 onto a solder powder 11 that continuously falls downward, so that the oversaturated solution adheres to the surface of the solder powder 11. The solder powder 14 to which the solution adheres, falls further downward from the portion where it has been sprayed with the oversaturated solution by the spraying device 12, and is heated while passing a hot-air drying device 15. Due to this heating, the solvent evaporates from the surface of the solder powder, and a solder powder 16 to which a salt of an organic acid adheres has been prepared. This method has excellent preparing efficiency, and a further advantage is that by adjusting the concentration of the oversaturated solution and the spray amount, the amount of salt of an organic acid formed on the surface of the solder powder can be controlled easily.

Another possible method for the surface treatment of the solder powder is, for example, plating. However, for plating, the control of the plating fluid and the retaining of the solder powder are difficult, and as a result, the costs are high. However, in the previously mentioned method, retaining the powder is unnecessary, and all that has to be done is spray the saturated solution evenly on the solder powder. Thus, with this method, a low-cost mass-production of solder powder to which the organic acid salt has been evenly adhered is possible just by controlling the concentration of the saturated solution and the drying temperature.

If the above method is performed in combination with classification of the solder powder, its preparing efficiency can be improved even further. In this case, the solder powder is provided from a classifying means such as a sieve 17, so that the part of the solder powder 11 that exceeds a certain diameter can be removed while the solder powder below this diameter falls downward. Thus, with this method, an even more efficient embodiment can be provided by performing it in continuation with the method for preparing a solder powder.

Second Embodiment

The following is an explanation of a second embodiment of the method for preparing a solder powder. This embodiment relates to a method for adhering the salt of an organic acid to the surface of a solder powder by immersing the solder powder into a solution that is oversaturated with a salt of an organic acid.

In this embodiment, salt of an organic acid is deposited on the surface of a solder powder by immersing the solder powder in a solution that is oversaturated with a salt of an organic acid, and stirring this solution for a certain period of time. In this case, the amount of salt of an organic acid that is deposited on the solder powder can be controlled for example with the concentration of the oversaturated solution, the amount of solder powder added, and the stirring time. The solder powder to whose surface the salt of an organic acid has been adhered is then retrieved from the solution, and dried to remove the solvent.

Figure 2:
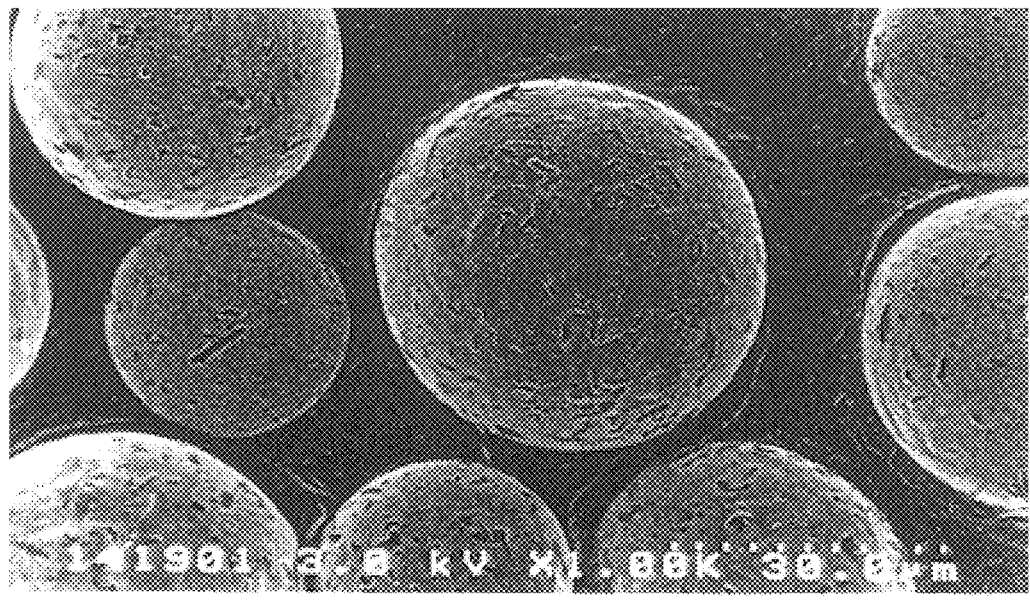
FIG. 2 shows a photograph of an example of a solder powder in accordance with the present invention, taken with a scanning electron microscope.

The following example explains this for the adherence of copper stearate to the surface of a Sn—Zn-based alloy powder. 90 g of solder powder were added to an oversaturated solution of 300 ml ethanol to which 9 g copper stearate has been added, and the solution was stirred for 15 min at about 800 rpm with a magnet stirrer. Then, the oversaturated solution and the solder powder were separated, and the solder powder was dried for 30 min in a furnace that was maintained at 60° C. When the surface of the resulting solder powder was observed with a scanning electron microscope, it could be ascertained that copper stearate is deposited on the surface of the solder powder, as shown in FIG. 2. The copper stearate covered about 10% of the surface of the solder powder.

Even when the salt of an organic acid does not cover the entire surface but only a part of the surface as shown in FIG. 2, it has the effect of preventing an oxidation of the Zn during the reflowing in air. In other words, if a solder paste that has been prepared by mixing a flux with a solder powder on which a salt of an organic acid is adhered partially is printed on a printed circuit board, and heated in a reflow furnace, the salt of an organic acid covers the solder powder when the temperature of the printed circuit board reaches the melting point of the salt of an organic acid (for example 120° C. for copper stearate), which prevents the oxidization of Zn due to the oxygen in air. Thereby, the creation of solder balls during the reflow method can be prevented.

Consequently, although there is no particular limitation, it is preferable that the melting point of the salt of an organic acid is lower than the melting point of the Sn—Zn-based alloy solder particles, if it is adhered partially on the surface of the solder particles.

Third Embodiment

The following is an explanation of a third embodiment of the method for preparing a solder powder. This embodiment relates to a method for adhering the salt of an organic acid to a solder powder by immersing the solder powder into a solution that is saturated with a salt of an organic acid, and subsequently lowering the solubility of the salt of an organic acid in this saturated solution.

The solubility of the salt of an organic acid can be reduced by changing at least one factor affecting the solubility. Examples of how the solubility can be changed thusly include changing temperature or pressure, or adding a new solute or a new solvent to the saturated solution. At least one of these actions is performed with the saturated solution, while avoiding a change of the conditions that is too sudden.

As illustrated by the examples above, if a lower alcohol such as methanol, ethanol, or isopropanol is added to the saturated solution of an organic solvent and a fatty acid salt with at least eleven carbons used for the salt of an organic acid, the solubility of the salt of an organic acid is lowered. In particular, it is preferable that these alcohols are gradually dripped into the saturated solution, because then the solubility of the salt of an organic acid can be lowered slowly, so that the salt of an organic acid can be deposited gradually.

With this embodiment, a thin-film coating can be formed on the surface of the solder powder by gradually depositing the salt of an organic acid from the solution saturated with the salt of an organic acid onto the surface of the solder particles. It is preferable to perform this process while stirring the solution, so that the solder particles stay dispersed in the solution.

Thus, the coating is applied to all the particles of the solder powder. This thin-film coating is an organic film with very homogenous thickness, which can be formed as a film covering the entire surface of the solder particles with a thickness of, for example, 0.1 to 5 $\mu$m or even 0.1 to 2 $\mu$m.

Thus, with the method of this embodiment, a solder powder can be prepared, whose surface is covered with a film of a salt of an organic acid.

EXAMPLES

The following is a more detailed explanation of the present invention by way of examples. However, the present invention is not limited to the scope of these examples.

Example 1

In this example, a solder powder of globular particles of Sn-8Zn-3Bi alloy with a particle diameter of 20 to 40 $\mu$m is immersed in an oversaturated solution of copper stearate dissolved in ethanol, as explained for the above-noted second embodiment, thereby preparing a solder powder on whose surface copper stearate is deposited. Samples of a solder paste were prepared by mixing flux with a solder powder with treated surface in some samples, and with a solder powder with untreated surface in other samples.

Sample 1
flux: 10 wt %

| | |
|---|---|
| rhodine (pine resin) | 50 wt % |
| hardened castor oil (thixo agent) | 5 wt % |
| diphenylguanidine HBr (activator) | 2 wt % |
| α-televineole (solvent) | 43 wt % |
| solder powder treated with copper stearate: 90 wt % | |

Sample 2
flux: 10 wt %

| | |
|---|---|
| rhodine (pine resin) | 48 wt % |
| hardened castor oil (thixo agent) | 5 wt % |
| diphenylguanidine HBr (activator) | 2 wt % |
| α-televineole (solvent) | 40 wt % |
| nonionic surfactant (BC-40TX) | 5 wt % |
| untreated solder powder: 90 wt % | |

-continued

Sample 3
flux: 10 wt %

| | |
|---|---|
| rhodine (pine resin) | 48 wt % |
| hardened castor oil (thixo agent) | 5 wt % |
| diphenylguanidine HBr (activator) | 2 wt % |
| α-televineole (solvent) | 40 wt % |
| nonionic surfactant (BC-40TX) | 5 wt % |
| solder powder treated with copper stearate: 90 wt % | |

Sample 4
flux: 10 wt %

| | |
|---|---|
| rhodine (pine resin) | 50 wt % |
| hardened castor oil (thixo agent) | 5 wt % |
| diphenylguanidine HBr (activator) | 2 wt % |
| α-televineole (solvent) | 43 wt % |
| untreated solder powder: 90 wt % | |

Sample 5
flux: 10 wt %

| | |
|---|---|
| rhodine (pine resin) | 43 wt % |
| hardened castor oil (thixo agent) | 5 wt % |
| diphenylguanidine HBr (activator) | 2 wt % |
| α-televineole (solvent) | 35 wt % |
| nonionic surfactant (BC-40TX) | 15 wt % |
| untreated solder powder: 90 wt % | |

A reliability test was performed with these solder pastes. A printed circuit board made of glass epoxy with copper-plated land portions for applying solder was used as a test board. The solder paste was printed on this printed circuit board, using a metal mask of 180 μm thickness in which a pattern of predetermined aperture portions had been etched and a metal squeegee. A semiconductor device having 100 pins with a 0.65 mm pitch and Pd-plated leads was used for the electric component to be surface-mounted. This semiconductor device was mounted on the land portions where solder paste had been printed, and the solder was melted and bonded to the printed surface board using an atmospheric hot-air reflow furnace that heats the soldering portions to a maximum temperature of 210° C.

The extent of the oxidization of the solder powder was evaluated by counting the number of solder balls created around one of the semiconductor leads after the soldering. The smaller the number of solder balls, the better the oxidation of the solder powder has been suppressed. The scale for the evaluation of the oxidation, based on the average number of solder balls created around one of the semiconductor leads, was A, B, C, D, in ascending order.

The change of the solder paste over time was evaluated by sealing the solder paste in a container, keeping it in a bath of constant temperature of 25° C.; and measuring its viscosity with a Malcom-type viscosity meter. The smaller the change of the viscosity and the longer the time it takes to reach a certain viscosity, the better the changes of the solder paste over time have been suppressed. The number of days until the viscosity was 100 Pa·s higher than the original viscosity was measured. The results are shown in Table 1.

TABLE 1

| | Creation of solder balls | change over time |
|---|---|---|
| Sample 1 | B | 7 days |
| Sample 2 | C | 12 days |
| Sample 3 | A | 15 days |
| Sample 4 | D | 3 days |
| Sample 5 | D | 15 days |

As is shown in Table 1, due to the adherence of copper stearate to the solder powder in Sample 1, the creation of solder balls and the change of the solder paste over time can be suppressed better than in Sample 4, which uses an untreated solder powder. Also in Sample 2, wherein a suitable amount of nonionic surfactant (5 wt %) has been added to the flux, the creation of solder balls and the change of the solder paste over time can be suppressed better than in Sample 4, to which no nonionic surfactant has been added. Comparing Samples 1 and 2, it can be seen that adhering copper stearate is more effective for the suppression of the number of solder balls created, whereas adding a nonionic surfactant is more effective for suppressing a change of the solder paste over time. The best effect could be attained with Sample 3, where a solder paste to which copper stearate was adhered and a flux to which a nonionic surfactant had been added were used.

On the other hand, in Sample 5, to which 15 wt % of a nonionic surfactant has been added, the number of solder balls created increased again. This is possibly because the nonionic surfactant prevents the wetting and spreading of the molten solder powder over the copper foil portions.

Figure 3:
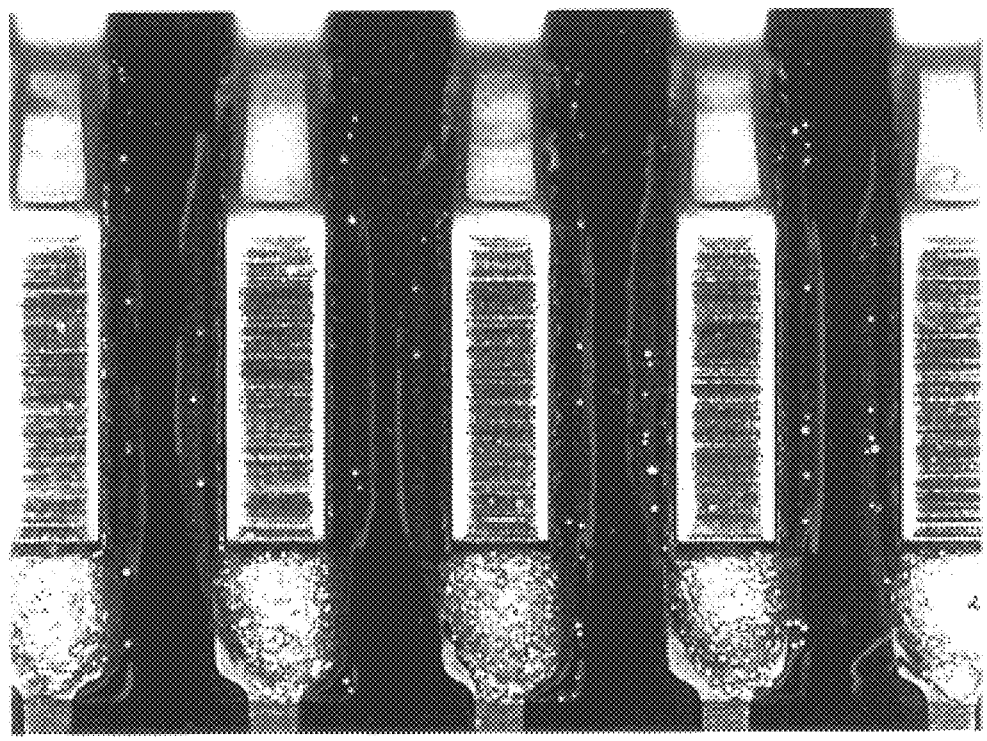
FIG. 3 shows an example of the vicinity of the semiconductor lead portions mounted using the solder paste in accordance with the present invention.
Figure 4:
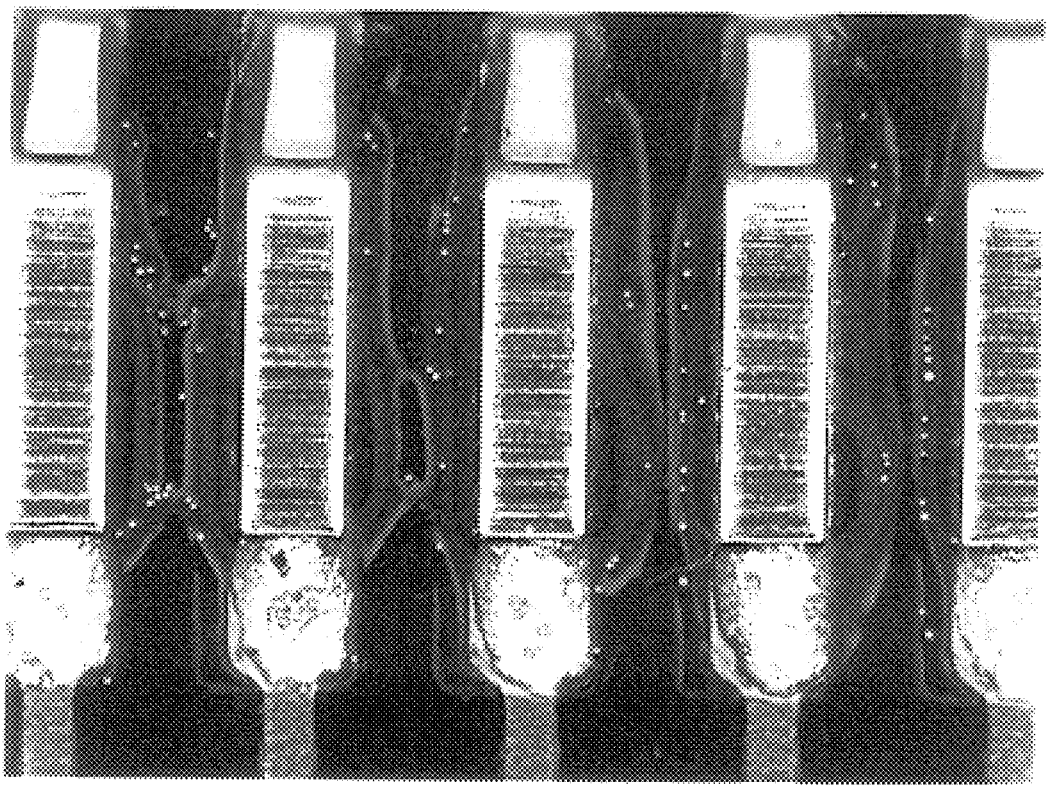
FIG. 4 shows another example of the vicinity of the semiconductor lead portions mounted using the solder paste in accordance with the present invention.

FIGS. 3 (Sample 1), 4 (Sample 2), 5 (Sample 3), and 6 (Sample 4) illustrate the creation of solder balls. Thus, in both samples, a large difference in the number of solder balls created around the semiconductor leads could be acknowledged.

Example 2

Figure 5:
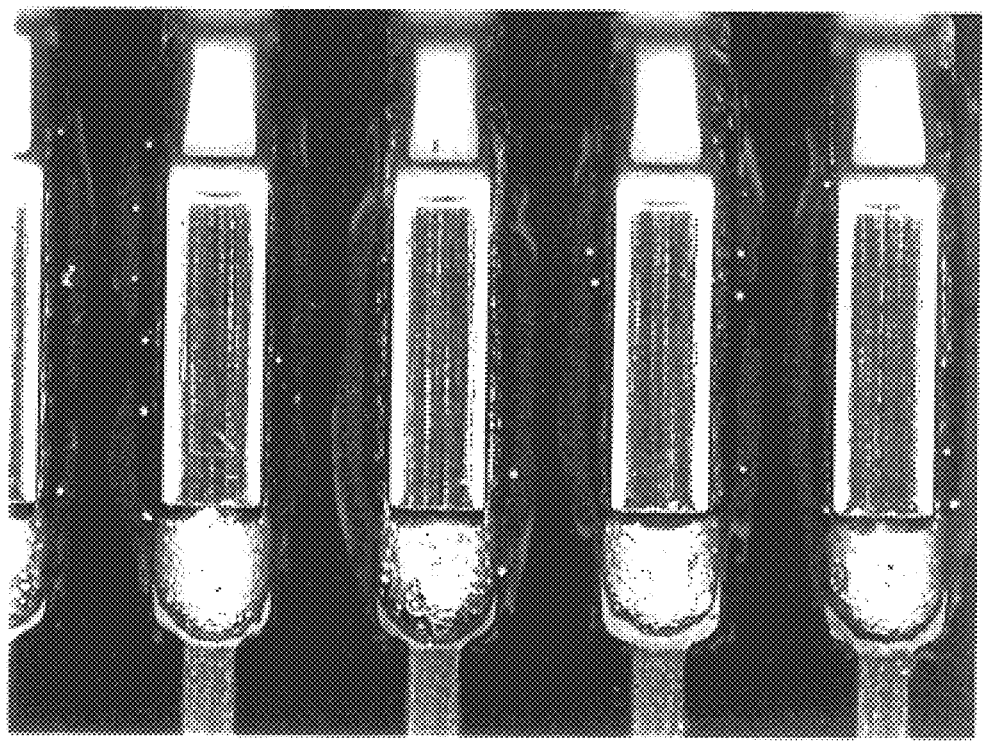
FIG. 5 shows still another example of the vicinity of the semiconductor lead portions mounted using the solder paste in accordance with the present invention.
Figure 6:
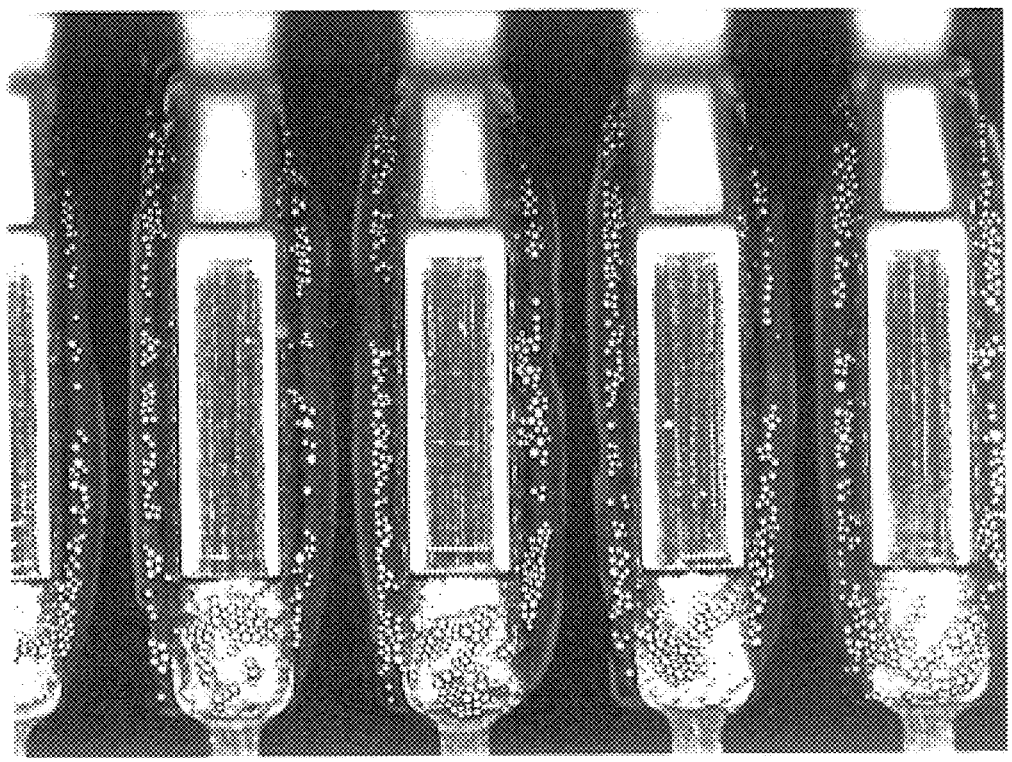
FIG. 6 shows an example of the vicinity of the semiconductor lead portions mounted using a conventional solder paste.
Figure 7:
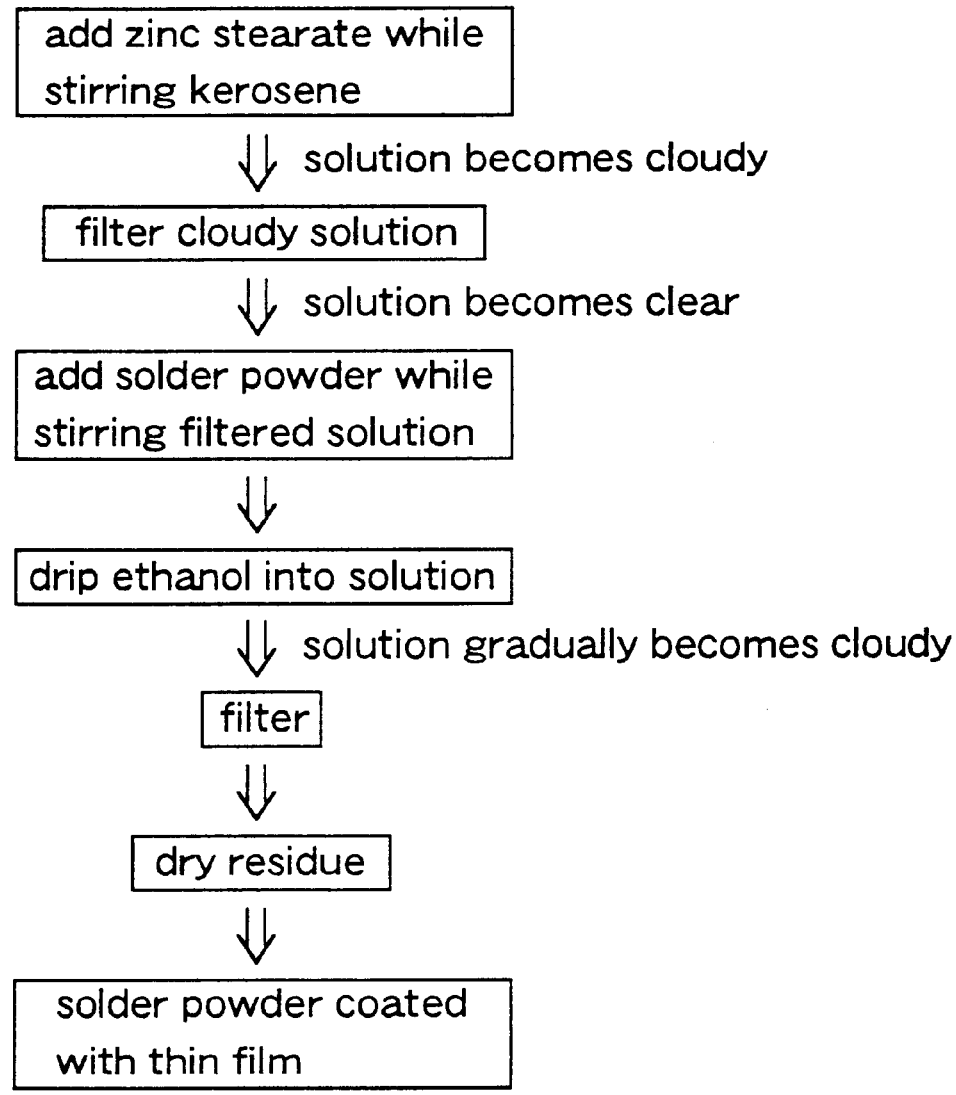
FIG. 7 illustrates an example of a process for preparing the solder paste in accordance with the present invention.

FIG. 5 is a flowchart illustrating the coating process for the solder powder of this example. This process is explained in the following:

First, 7.8 g zinc stearate was added to 1000 ml (780 g) kerosene, while stirring with a magnet stirrer at about 700 rpm. The amount of zinc stearate added exceeds the amount soluble in kerosene, so that the solution became cloudy. The solution was then filtered with filter paper of 8 μm mesh diameter, to obtain a kerosene solution saturated with zinc stearate.

Then, 78 g of Sn-8Zn-3Bi-based alloy zinc powder was added to this saturated solution while stirring with a magnet stirrer, as described above. The average particle size of the solder powder was about 30 μm. Observing the solder powder with a scanning electron microscope, it could be ascertained that the solder particles were practically globular.

While continuing to stir as described above, small amounts of ethanol were dripped into this saturated solution. When about 10 ml ethanol had been dripped into the solution, it started to become cloudy. After a certain amount of ethanol has been dripped, the cloudy solution was filtered again, the residue on the filter paper was dried for 8 hours in a furnace at 80° C., whereby a solder powder covered with a thin film was obtained. The speed with which the ethanol was dripped into the solution was about 2 ml/min, and the total amount of ethanol added was in the range of 10 to 100 ml.

Solder powder A was obtained by adding 100 ml ethanol, and solder powder B was obtained by adding 10 ml ethanol.

Figure 8:
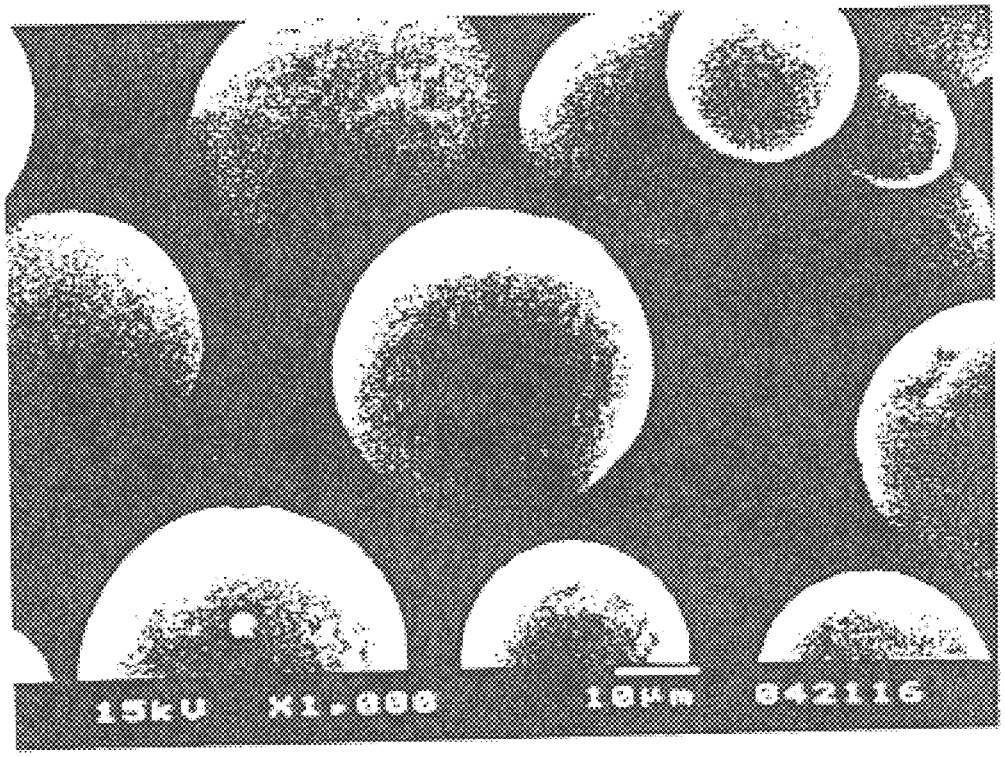
FIG. 8 shows a photograph of an example of a solder powder in accordance with the present invention, taken with a scanning electron microscope.
Figure 9:
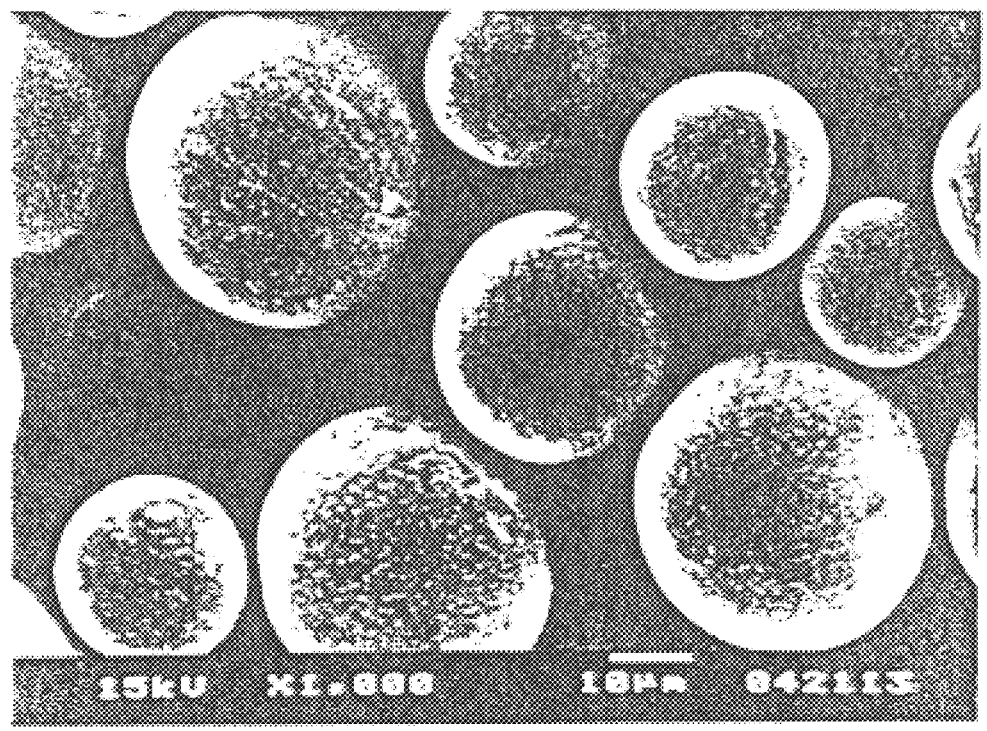
FIG. 9 shows a photograph of another example of a solder powder in accordance with the present invention, taken with a scanning electron microscope.

Both solder powders were observed with a scanning electron microscope. The result is shown in FIGS. 8 and 9. It can be seen that the solder powders are almost homogeneously coated, and their globular particle shape could be maintained. Moreover, with a FE-SEM (field emission scanning electron microscope), it could be ascertained that the coating thickness of the solder powder A is about 2 μm, and that of the solder powder B is about 1 μm.

The thickness of the coating increases with the amount of ethanol dripped into the solution. It also could be ascertained that the thickness of the coating increased, the longer the stirring time (that is, the time the solution was stirred after the ethanol had been dripped into it) was, and the lower the temperature was. Moreover, the solder powders shown in FIGS. 8 and 9 have been obtained at room temperature (about 25° C.) and a stirring time of about 10 min.

Figure 10:
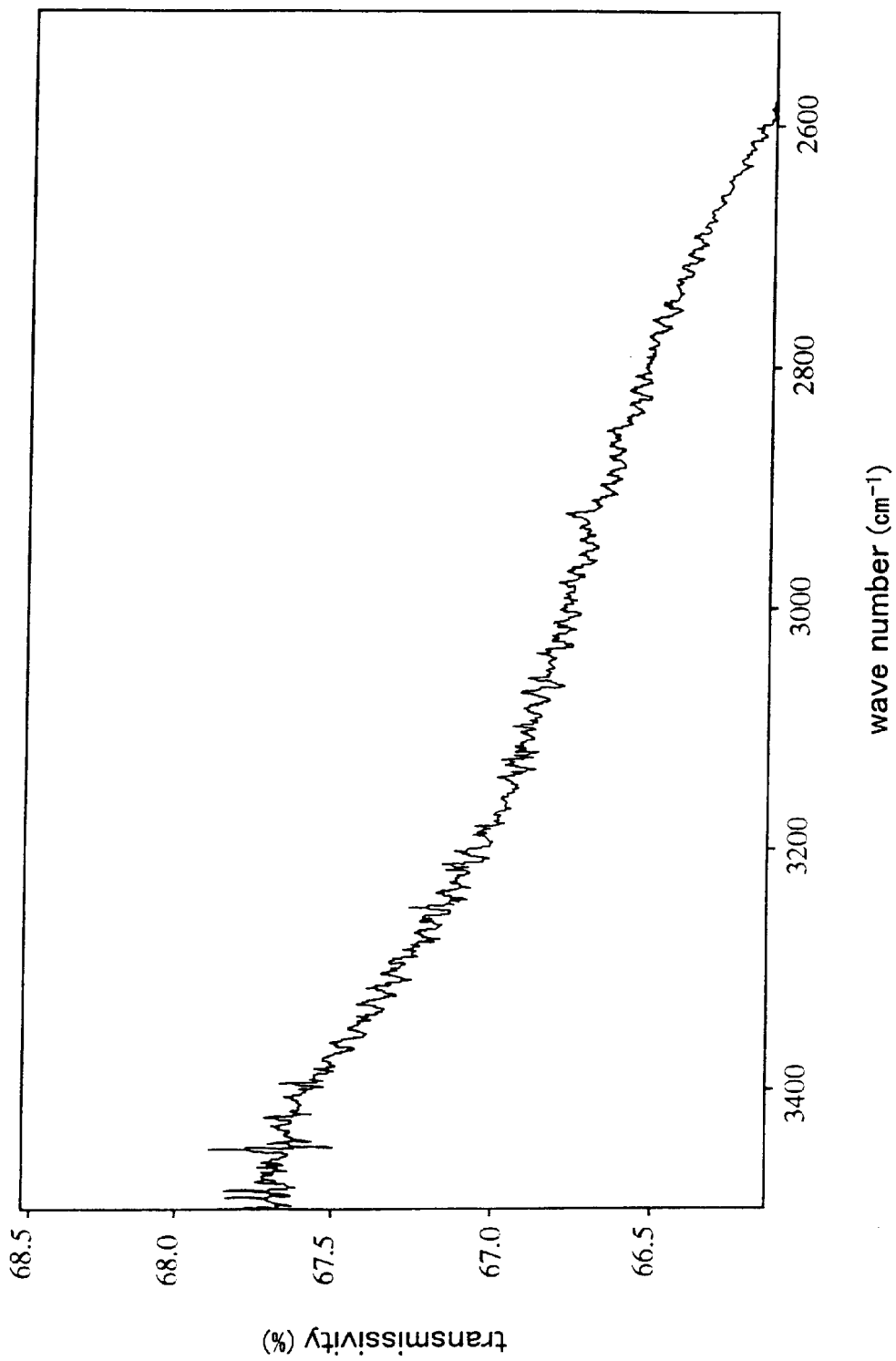
FIG. 10 shows the absorption spectrum of a solder alloy used for the production of the solder powder in accordance with the present invention, measured by FT-IR.
Figure 11:
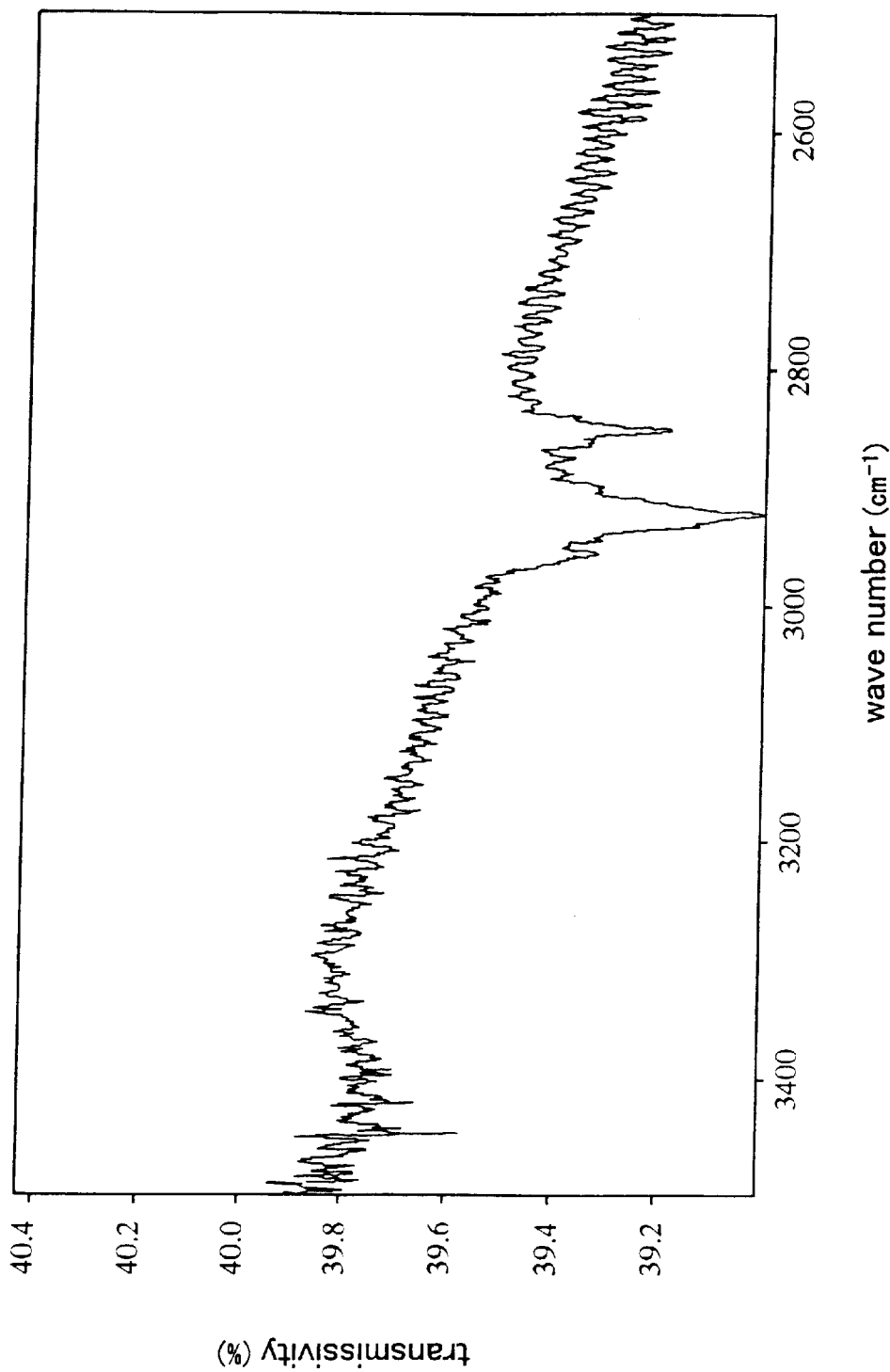
FIG. 11 shows the absorption spectrum of a solder powder produced by coating the solder alloy whose spectrum is shown in FIG. 10 with a thin film, also measured by FT-IR.

To verify the quality of the coating, the absorption spectrum of the solder powder was measured before and after the coating, using FT-IR (fourier-transform infra-red spectroscopy). FIG. 10 shows the spectrum before the coating, and FIG. 11 shows the spectrum after the coating. As is shown in FIG. 11, an absorption peak due to the C-H oscillation of the stearate in the coated solder powder, which cannot be observed in FIG. 10, could be observed near 2890 $cm^{-1}$.

Figure 12:
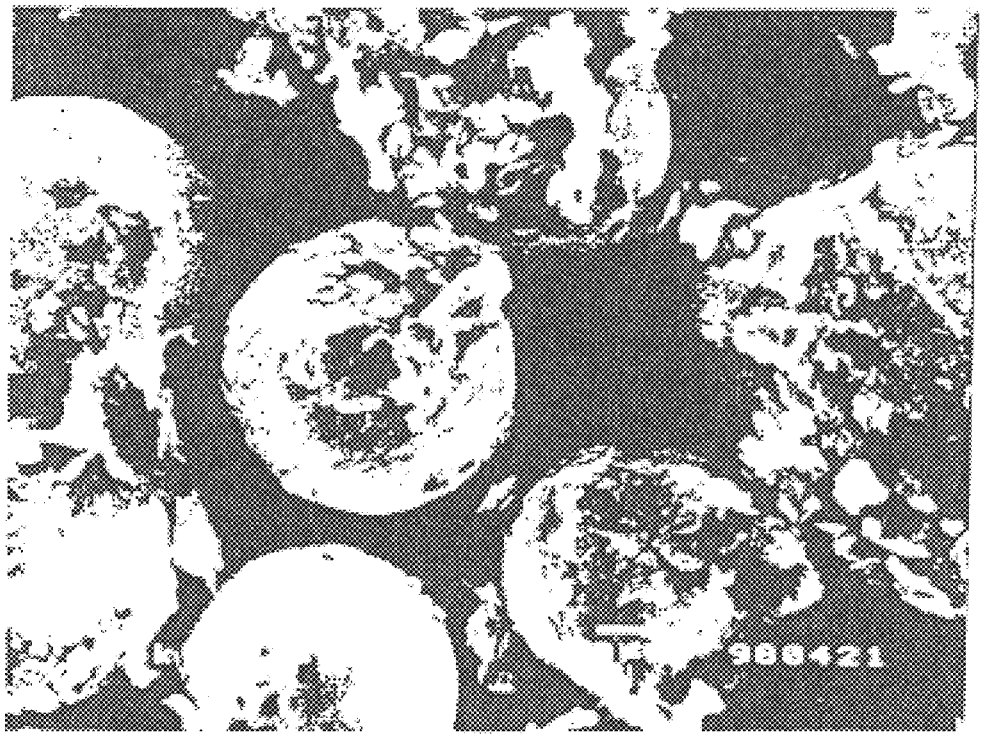
FIG. 12 shows a photograph of a comparative example of a solder powder, taken with a scanning electron microscope.

On the other hand, 78 g of the above-noted solder powder was immersed in an oversaturated solution obtained by adding 7.8 g zinc stearate to 1000 ml kerosene, as described above. After keeping the solution still for 0.5 h, it was filtered, and the residue was dried, whereby a solder powder C was obtained. FIG. 12 shows the result of observing this solder powder C with a scanning electron microscope. As is shown in FIG. 12, the coating formed on the solder powder C is not uniform: lump-shaped depositions adhere to some particles, while other particles are not completely coated. Thus, it could be ascertained that a uniform coating could not be attained by merely immersing the solder powder in a solution.

A solder paste was prepared using the solder powders A to C obtained as explained above, and a solder powder D without coating. Table 2 illustrates the combinations of solder powders and fluxes. Table 3 illustrates the composition of the fluxes.

TABLE 2

|  | solder powder | flux | weight ratio solder/flux |
|---|---|---|---|
| solder paste A | solder powder A (coating thickness: 2 μm) | flux A | 9:1 |
| solder paste B | solder powder B (coating thickness: 1 μm) | flux A | 9:1 |
| solder paste C | solder powder C (incomplete coating) | flux A | 9:1 |
| solder paste D | solder powder D (no coating) | flux B | 9:1 |

TABLE 3

(in wt %)

| component | flux A | flux B |
|---|---|---|
| pine resin (polymeric rhodine) | 55 | 45 |
| solvent (ethyleneglycol monophenylether) | 40 | 35 |
| activator (diethylamine hydrochloride) | 5 | 20 |

The ratio of the activator in flux A and flux B was set so that the solder powders A and D had about the same viscosity, which was in the range where screen printing is possible. As is shown in Table 2, a larger amount of the activator is required for flux B.

The pot life of the solder pastes A to D was measured. "Pot life" means the time for which the viscosity of the paste can be maintained so that the printing on a circuit board does not become difficult (generally, not more than 400 Pa·s). Here, the pot life was defined as the time that it takes for the viscosity of the solder paste to increase from 200 Pa·s to 400 Pa·s, when kept at room temperature. Table 4 illustrates the results of the pot life measurement.

TABLE 4

| sample | pot life (in days) |
|---|---|
| solder paste A | 10 |
| solder paste B | 5 |
| solder paste C | 2 |
| solder paste D | 1 |

As is shown in Table 4, the pot life becomes longer for uniform and thick coatings. This is so, because the suppression of oxidation of the Zn on the surface of the solder particles and the suppression of the bonding among the particles suppresses a thickening of the paste.

Then, screen-printing with a metal mask (of 150 to 200 μm stainless steel, whose holes have been cut by a laser) using the solder pastes A to D was examined. It was not difficult to push the solder pastes through the mask, except for the solder paste C, which could be used for one printing, but tended to clog the mask, so that further printings were difficult. The reason for this is that its coating is not uniform, and as the oxidization of the solder powder progresses, the solder particles stick together and the solder paste thickens.

Then, the solder pastes A, B, and D were screen-printed on a circuit board, and reflowing was performed in air. A sulfur dioxide corrosion test was performed for all soldering portions formed on the board. In the sulfur dioxide corrosion test, the board was exposed for 100 h to 40° C. air containing 10 ppm sulfur dioxide, and then it was ascertained visually whether the solder portions had bleached. The result was that bleaching could not be observed for the soldering portions formed with solder pastes A and B, but for those formed with solder paste D. This is, because the amount of activator in the solder pastes A and B could be reduced below the amount used for solder paste D.

As explained above, it could be established that the particles of the solder alloy containing Zn could be coated with a thin film with a uniformity that was so good that the particles maintained their original shape. This was possible by controlling the deposition of the coating material in the saturated solution. This thin-film coating does not impede the applicability of the solder paste to screen printing, although the surface of the solder particles is completely covered. Moreover, by using such a solder powder, which has been coated with a thin film, the amount of activator in the paste could be reduced, so that bleaching of the soldering portions after the soldering could be avoided, and the pot life could be prolonged.

The present invention is not limited to the above-described embodiments and examples.

INDUSTRIAL APPLICABILITY

As mentioned above, the present invention can provide a solder powder including Sn and Zn, which has good soldering properties, and wherein reactions between the activation component in the flux and the alloy component can be suppressed. Furthermore, the present invention can provide a solder paste including Sn and Zn, having good soldering properties, whose change over time can be suppressed. This solder paste can be reflowed in the air. The present invention is very useful from an industrial viewpoint since the present invention can provide a useful lead-free solder powder and a solder paste.

What is claimed is:

1. A solder powder for forming a solder paste together with a flux, the solder powder comprising Sn and Zn, wherein a salt of an organic acid is adhered to a surface of the solder powder.

2. The solder powder according to claim 1, further comprising Bi.

3. The solder powder according to claim 1, wherein the salt of an organic acid is a fatty acid salt.

4. The solder powder according to claim 3, wherein the fatty acid salt is at least one salt of a fatty acid selected from the group consisting of lauric acid, myristic acid, palmitic acid, and stearic acid.

5. The solder powder according to claim 1, wherein the salt of an organic acid comprises a transition metal.

6. The solder powder according to claims 1, wherein the salt of an organic acid is a copper salt of an organic acid.

7. The solder powder according to claim 6, wherein the copper salt of an organic acid adheres to at least 5% of the surface.

8. The solder powder according to claim 1, wherein the solder powder is covered with a thin film of the salt of an organic acid.

9. The solder powder according to claim 8, wherein the thickness of the thin film of the salt of an organic acid is 0.1 $\mu$m to 10 $\mu$m.

10. A solder paste comprising a solder powder and a flux, wherein the solder powder comprises Sn and Zn, and a salt of an organic acid is adhered to the surface of the solder powder.

11. The solder paste according to claim 10, wherein the flux comprises a nonionic surfactant.

12. The solder paste according to claim 11, wherein the nonionic surfactant accounts for 0.5 to 10 wt % of the flux.

13. The solder paste according to claim 10, wherein the flux comprises an activator, which accounts for at most 10 wt % of the flux.

14. A method for preparing a solder powder, comprising:

preparing a solution saturated with a salt of an organic acid; and contacting said salt of an organic acid with a solder powder comprising Sn and Zn so as to adhere said salt of an organic acid to a surface of said solder powder.

15. The method for preparing a solder powder according to claim 14, wherein said salt of an organic acid is adhered to a surface of said solder powder by spraying the solution saturated with a salt of an organic acid onto the solder powder.

16. The method for preparing a solder powder according to claim 15, wherein the solution saturated with a salt of an organic acid is sprayed onto the falling solder powder, and wherein the solvent of said solution is removed from the surface of the solder powder by heating the falling solder powder.

17. The method for preparing a solder powder according to claim 14, wherein said salt of an organic acid is adhered to a surface of said solder powder by dispersing the solder powder in the solution saturated with a salt of an organic acid.

18. The method for preparing a solder powder according to claim 16, wherein the salt of an organic acid is deposited on the surface of the solder powder by lowering the solubility of the salt of an organic acid in the solution saturated with the salt of an organic acid.

19. The method for preparing a solder powder according to claim 18, wherein the solubility of the salt of an organic acid in the solution is lowered by dripping an alcohol into the solution.

20. A solder paste comprising a solder powder and a flux, wherein the solder powder comprises Sn and Zn, and a salt of an organic acid comprising a transition metal is adhered to the surface of the solder powder.

21. The solder paste according to claims 20, wherein the flux comprises a nonionic surfactant.

22. The solder paste according to claim 21, wherein the nonionic surfactant accounts for 0.5 to 10 wt % of the flux.

23. The solder paste according to claim 20, wherein the flux comprises an activator, which accounts for at most 10 wt % of the flux.

* * * * *